(12) United States Patent
Ji et al.

(10) Patent No.: US 7,371,688 B2
(45) Date of Patent: May 13, 2008

(54) REMOVAL OF TRANSITION METAL TERNARY AND/OR QUATERNARY BARRIER MATERIALS FROM A SUBSTRATE

(75) Inventors: Bing Ji, Allentown, PA (US); Martin Jay Plishka, Apache Junction, AZ (US); Dingjun Wu, Macungie, PA (US); Peter Richard Badowski, White Haven, PA (US); Eugene Joseph Karwacki, Jr., Orefield, PA (US)

(73) Assignee: Air Products and Chemicals, Inc., Allentown, PA (US)

( * ) Notice: Subject to any disclaimer, the term of this patent is extended or adjusted under 35 U.S.C. 154(b) by 214 days.

(21) Appl. No.: 10/942,301

(22) Filed: Sep. 15, 2004

(65) Prior Publication Data

US 2005/0112901 A1 May 26, 2005

Related U.S. Application Data

(60) Provisional application No. 60/507,224, filed on Sep. 30, 2003.

(51) Int. Cl.
*H01L 21/302* (2006.01)
*H01L 21/461* (2006.01)
(52) U.S. Cl. .............. 438/710; 438/714; 438/905; 257/E21.218; 257/E21.31; 257/E21.311
(58) Field of Classification Search .......... 438/710, 438/714, 905; 257/E21.311, E21.218
See application file for complete search history.

(56) References Cited

U.S. PATENT DOCUMENTS 5,425,842 A    6/1995  Zijlstra
5,486,235 A    1/1996  Ye et al.
5,788,778 A    8/1998  Shang et al.
6,197,699 B1 * 3/2001  Fritzinger et al. .......... 438/710
6,214,247 B1 * 4/2001  Leverenz et al. ............. 216/56
6,379,575 B1 * 4/2002  Yin et al. ..................... 216/67
6,544,345 B1   4/2003  Mayer et al.
6,559,001 B2 * 5/2003  Athavale et al. ........... 438/243
6,736,147 B2 * 5/2004  Satoh et al. ................. 134/1.1

OTHER PUBLICATIONS

C. Reyes-Betanzo, et al., "Study of Conditions for Anisotropic Plasma Etching of Tungsten and Tungsten Nitride Using $SF_6$/Ar Gas Mixtures", Journal of the Electrochemical Society, 149 (3), p. G179-G183, 2002.
Wei-Min Li, et al., "Deposition of $WN_xC_y$ Thin Films by ALCVD Method for Diffusion Barriers in Metallization", Proceedings of the 5th IEEE International Interconnect Technology Conference, Burlingame, CA.

* cited by examiner

*Primary Examiner*—Michael Lebentritt
*Assistant Examiner*—Ron E Pompey
(74) *Attorney, Agent, or Firm*—Joseph D. Rossi

(57) ABSTRACT

A process for the selective removal of a substance from a substrate for etching and/or cleaning applications is disclosed herein. In one embodiment, there is provided a process for removing a substance from a substrate comprising: providing the substrate having the substance deposited thereupon wherein the substance comprises a transition metal ternary compound, a transition metal quaternary compound, and combinations thereof; reacting the substance with a process gas comprising a fluorine-containing gas and optionally an additive gas to form a volatile product; and removing the volatile product from the substrate to thereby remove the substance from the substrate.

19 Claims, 2 Drawing Sheets

Experimental setup for remote plasma etching/cleaning

Experimental setup for in situ plasma etching/cleaning

Experimental setup for remote plasma etching/cleaning

Experimental setup for in situ plasma etching/cleaning

Sample coupons after in situ plasma etching/cleaning

Experimental setup for thermal etching/cleaning

REMOVAL OF TRANSITION METAL TERNARY AND/OR QUATERNARY BARRIER MATERIALS FROM A SUBSTRATE

CROSS-REFERENCE TO RELATED APPLICATIONS

This application claims the benefit of U.S. Provisional Application No. 60/507,224, filed 30 Sep. 2003.

BACKGROUND OF THE INVENTION

In recent years, the semiconductor industry has widely adopted copper or copper-containing compounds as conductive materials and low dielectric constant (low-k) materials as insulating materials for interconnection between transistors in integrated circuit (IC) manufacturing. One manufacturing step that helps ensure the successful integration of copper and low-k dielectric materials is the deposition of barrier materials between copper and dielectric materials. The barrier materials may also be called diffusion barrier or liner materials. Barrier materials may serve both as a diffusion barrier that prevents the diffusion or migration of the conductive materials into the insulating materials and active regions of transistors, and as an adhesion promoter that eliminates delamination and voids between the conductive materials and the surrounding regions of insulating, dielectric materials.

Materials that are suitable for use as barrier materials generally possess one or more of the following qualities: strong mechanical and structural integrity, high electrical conductivity, good conformal coverage over device features, and high chemical, mechanical, and electrical stability against defect formation. Furthermore, barrier materials should have one or more of the aforementioned qualities at increasingly reduced thickness. For example, a typical barrier layer thickness may be 20 nm for a 150 nm device.

Barrier materials have evolved from transition metals such as, tantalum and tungsten, to transition metal binary compounds such as, for example, tantalum nitride ($TaN_x$) and tungsten nitride ($WN_x$). More recently, transition metal ternary compounds such as tungsten-nitride-carbide ($WN_xC_y$), tantalum-silicon-nitride ($TaSi_xN_y$), and tungsten-silicon-nitride ($WSi_xN_y$) have been considered for use as a barrier material. In this connection, one such material, tungsten-nitride-carbide ($WN_xC_y$), may be suitable for use as a barrier material in deep sub-100 nm IC devices because it is a highly refractory material with high mechanical and chemical stability even at elevated temperatures. The incorporation of carbon into these barrier materials greatly enhances the chemical and mechanical stabilities of the barrier film so that a much thinner film (<5 nm) is adequate as the copper diffusion barrier.

Transition metal ternary compound thin films are typically deposited from chemical precursors that are reacted in a processing chamber to form films in a chemical vapor deposition (CVD) process such as metal-organic chemical vapor deposition (MOCVD). As the barrier layer thickness further decreases, these barrier materials may be deposited onto semiconductor substrates (wafers) by atomic layer deposition (ALD) or atomic layer chemical vapor deposition processes (ALCVD) in which the films are deposited in controlled, nearly monoatomic layers. A high quality thin barrier film of tungsten nitride carbide can be deposited, for example, by ALD through a pulsed exposure sequence of $NH_3$ (ammonia), $B(C_2H_5)_3$ (triethyl boron), and $WF_6$ (tungsten hexafluoride) at one or more temperatures ranging from 300 to 350° C. An example of an ALD deposition of a $WN_xC_y$ film is provided, for example, in the reference Wei-Min Li et al., "Deposition of $WN_xC_y$ thin films by ALCVD method for diffusion barriers in metallization", Proceedings of the 5th IEEE International Interconnect Technology Conference, Burlingame, Calif.

While the deposition process desirably forms barrier films on a substrate (typically a silicon wafer), the reactions that form these films also occur non-productively on other exposed surfaces inside of the processing chamber. Accumulation of deposition residues results in particle shedding, degradation of deposition uniformity, and processing drifts. These effects can lead to wafer defects and subsequent device failure. Therefore, periodic cleaning of the processing chambers, also referred to as chamber cleaning, is necessary. CVD chambers used for deposition of tungsten (W) metal films and binary tungsten compounds such as tungsten silicide are typically cleaned with fluorine-containing plasmas. In these cleaning processes, atomic fluorine can react with tungsten and silicon to form volatile byproducts such as, for example, $WF_m$(m=1-6) and $SiF_n$(n=1-4). The volatile byproducts are then removed from the chamber by vacuum pump.

While there is a large body of work on etching tungsten metal, and dry cleaning of conventional CVD chambers used for depositing tungsten metal and other dielectric materials such as $SiO_2$, these applications and processes are not directly applicable to transition metal ternary compounds such as tungsten-nitride-carbide ($WN_xC_y$) because these materials are much more chemically stable and highly refractory. Furthermore, the incorporation of carbon into certain transition metal ternary materials poses additional challenges. Unlike tungsten and silicon, the carbon component in a thin film or deposition residue does not typically form volatile byproducts with fluorine atoms. Instead, the carbon component tends to form nonvolatile fluorocarbon polymer residues. As tungsten and/or silicon components are removed as volatile byproducts, the remaining residues become carbon enriched. Such a problem has become well known in etching and cleaning of carbon-doped silicate glass (CSG) low dielectric constant materials. In the case of tungsten carbide (WC), fluorine-containing plasmas preferentially remove the tungsten component and leave the carbon particles behind.

CVD and/or ALD chambers used for tungsten carbide and tungsten depositions have to be periodically disassembled and cleaned by mechanical means (scrubbing or blasting) and/or by wet chemical solutions. A mixture of potassium ferricyanide ($K_3Fe(CN)_6$), sodium hydroxide (NaOH), and water ($H_2O$) has been found to effectively remove WC coatings. Mechanical and wet clean processes are time consuming and labor intensive.

Accordingly, the IC industry needs a viable dry chamber cleaning technology that can reliably remove the deposition residues of transition metal ternary compounds. Compared with wet or mechanical cleaning, dry chamber cleaning preserves process chamber vacuum. Compared with disassembling the process chamber followed by wet or mechanical cleaning, a dry cleaning technology can greatly minimize chamber down time, and hence increase wafer throughput.

BRIEF SUMMARY OF THE INVENTION

The present invention is directed, in part, to processes for removing a substance from a substrate. In one aspect of the present invention, there is provided a process for removing a substance from at least a portion of a substrate comprising: providing the substrate comprising the substance selected from a transition metal ternary compound, a transition metal quaternary compound, and mixtures thereof deposited thereupon; reacting the substance with a process gas comprising a fluorine-containing gas and optionally an additive gas to form a volatile product; and removing the volatile product from the substrate to thereby remove the substance from the substrate.

In another aspect of the present invention, there is provided a process for cleaning a substance from a process chamber surface comprising: providing a process chamber containing the process chamber surface wherein the process chamber surface is at least partially coated with a film comprising the substance selected from a transition metal ternary compound, a transition metal quaternary compound, and mixtures thereof; reacting the substance with a process gas comprising a fluorine-containing gas to form a volatile product wherein the fluorine-containing gas comprises at least one member selected from $NF_3$, $ClF_3$, $ClF$, $SF_6$, a perfluorocarbon, a hydrofluorocarbon, $F_2$, a gas having the formula $NF_nCl_{3-n}$, where n is a number ranging from 1 to 2, and mixtures thereof; and removing the volatile product from the process chamber to thereby remove the substance from the substrate.

In a further aspect, there is provided a process for removing a substance from at least a portion of a substrate comprising: providing the substrate having the substance comprising a transition metal carbonitride; reacting the substance with a process gas comprising a fluorine containing gas and optionally an additive gas to form a volatile product; and removing the volatile product from the substrate to thereby remove the substance from the substrate.

In yet another aspect, there is provided a process for removing a substance from at least a portion of a substrate comprising: providing the substrate having the substance comprising a transition metal silicon nitride; reacting the substance with a process gas comprising a fluorine containing gas and optionally an additive gas to form a volatile product; and removing the volatile product from the substrate to thereby remove the substance from the substrate.

In a still further aspect, there is provided a process for removing a substance from at least a portion of a substrate comprising: providing the substrate having the substance comprising a transition metal quaternary compound; reacting the substance with a process gas comprising a fluorine containing gas and optionally an additive gas to form a volatile product; and removing the volatile product from the substrate to thereby remove the substance from the substrate.

These and other aspects of the present invention are provided in the following detailed description.

DETAILED DESCRIPTION OF THE INVENTION

Figure 1:
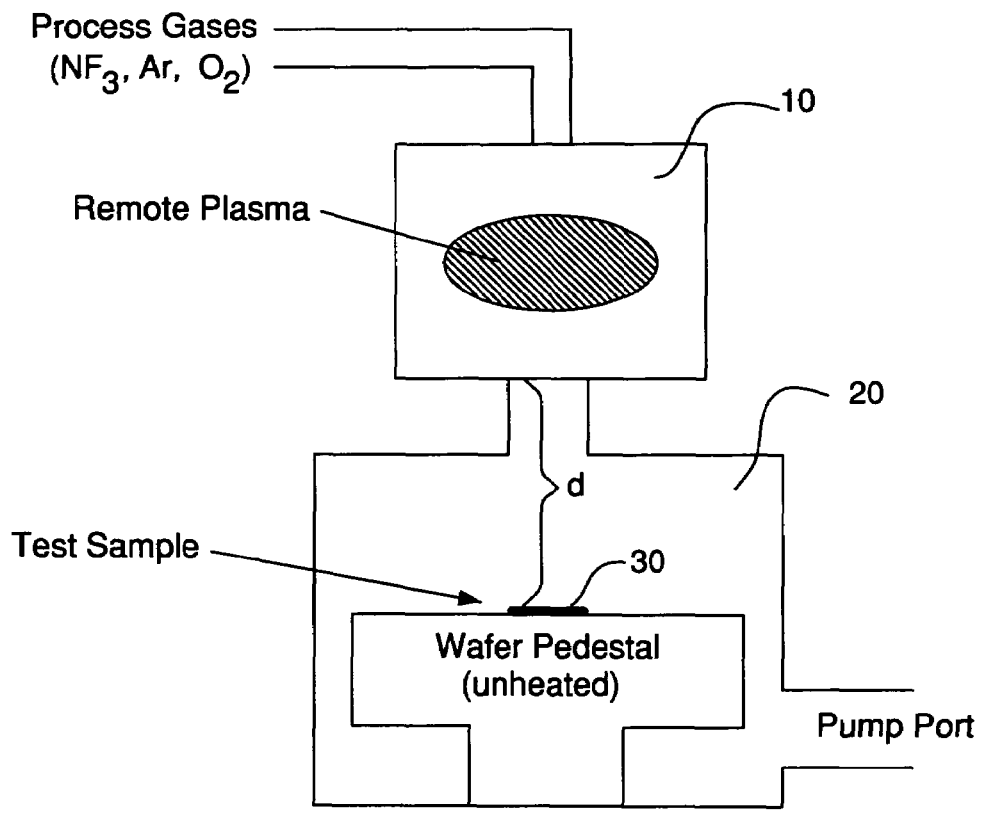
FIG. 1 is a schematic diagram of an experimental apparatus relating to remote plasma cleaning.

The process described herein is suitable for dry-etching barrier materials and dry-cleaning chemical vapor deposition (CVD), atomic layer deposition (ALD), or atomic layer chemical vapor deposition (ALCVD) chambers and other process chambers used to deposit transition metal ternary compounds and/or transition metal quaternary compounds onto wafer surfaces. Unlike traditional wet-etching and wet-cleaning processes, the dry-etching and dry-cleaning process described herein does not immerse the substrate in nor expose the substrate to liquid chemical solutions.

In one particular embodiment of the present invention, the process removes a non-volatile substance from at least a portion of a substrate. The material to be removed from the surface being etched or cleaned is converted from a solid non-volatile material into species having higher volatility which allows them to be readily removed by the process chamber vacuum pumps or other means by exposure to a process gas mixture comprising a fluorine-containing gas. Thus, in preferred embodiments, a substance may be removed from a substrate by contacting it with the process gas under conditions sufficient to react with the substance and form volatile products. The term "volatile products", as used herein, relates to reaction products and by-products of the reaction between the substance to be removed and the process gas.

The process described herein is useful for etching semiconductor substrates and cleaning process chambers for semiconductor manufacturing. Suitable substrates that may be used include, but are not limited to, semiconductor materials such as gallium arsenide ("GaAs"), boronitride ("BN") silicon, and compositions containing silicon such as crystalline silicon, polysilicon, amorphous silicon, epitaxial silicon, silicon dioxide ("$SiO_2$"), silicon carbide ("SiC"), silicon oxycarbide ("SiOC"), silicon nitride ("SiN"), silicon carbonitride ("SiCN"), organosilicate glasses ("OSG"), organofluorosilicate glasses ("OFSG"), fluorosilicate glasses ("FSG"), and other appropriate substrates or mixtures thereof. Substrates may further comprise a variety of layers to which the film is applied thereto such as, for example, antireflective coatings, photoresists, organic polymers, porous organic and inorganic materials, metals such as copper and aluminum, and/or diffusion barrier layers such as the transition metal ternary compounds disclosed herein. In one embodiment, the transition metal ternary barrier layer may be deposited by a CVD, PECVD, or other process followed by a subsequent removal of a portion of the barrier layer. This may allow for the formation of extremely thin films, i.e., <50 nm.

In some embodiments, the process described herein may be used to clean surfaces within a process chamber that is used to deposit transition metal ternary compounds and/or transition metal quaternary compounds. In embodiments wherein the process is a chamber cleaning process, the process chambers can be, for example, chemical vapor deposition (CVD) process chambers, metal-organic chemical vapor deposition (MOCVD) process chambers, atomic layer deposition (ALD) process chambers, atomic layer chemical vapor deposition (ALCVD) process chambers, physical vapor deposition (PVD) process chambers, and sputter coating process chambers. These transition metal ternary and quaternary compounds may be deposited, for example, by chemical vapor deposition (CVD), metal-organic chemical vapor deposition (MOCVD), atomic layer deposition (ALD), atomic layer chemical vapor deposition (ALCVD), plasma enhanced chemical vapor deposition (PECVD), or other means. The process disclosed herein is useful for cleaning deposition residues from the inside of process chambers and the surfaces of various fixtures contained therein such as, but not limited to, fluid inlets and outlets, showerheads, work piece platforms, etc. while minimizing damage thereto. The surface of the chamber and fixtures contained therein may be comprised of a variety of different materials including metals, such as titanium, aluminum, stainless steel, nickel, or alloys comprising same, and/or insulating materials, such as a ceramic, e.g., quartz or $Al_2O_3$.

In certain embodiments, the process chamber can remain at substantially similar operating conditions (pressure and temperature) during the cleaning operation as during the deposition operation. For example, in embodiments wherein the process chamber is used for CVD, the flow of deposition gas is stopped and purged from the process chamber and delivery lines. If needed, the temperature of the process chamber may be changed to an optimum value; however, in preferred embodiments, the process chamber temperature is maintained at the deposition process conditions. A process gas is flowed into the process chamber and activated to provide reactive species. The reactive species converts the deposition residues into a volatile product that is removed from the chamber. After a prescribed time, or after the concentration of the formed volatile products detected in the chamber effluent is below an acceptable level, the flow of process gas is stopped and preferably purged from the chamber and delivery lines. The flow of the deposition gas is then restarted and the CVD deposition process resumed.

As previously mentioned, the substance to be removed is a transition metal ternary or quaternary compound. The transition metals in these compounds may be, for example, titanium, tungsten, chromium, tantalum, molybdenum, zirconium, vanadium, or mixtures thereof. Examples of transition metal ternary compounds include $TaN_xC_y$, $WN_xC_y$, $TaSi_xN_y$, $TaSi_xC_y$, $WSi_xN_y$, and $WSi_xC_y$, etc. where the subscripts "x" and "y" in the range of 0.05 to 10.0 designate transition metal carbonitrides, transition metal silicon nitrides, transition metal silicon carbides, and transition metal silicon carbonitrides that are not necessarily stoichiometric, having a wide range of phases with varying metal/nitrogen, metal/carbon, and metal/silicon ratios. Exemplary transition metal carbonitrides include titanium carbonitride (TiNC), tantalum carbonitride (TaNC), chromium carbonitride, tungsten carbonitride, molybdenum carbonitride, and zirconium carbonitrides. Exemplary transition metal silicon nitrides include titanium silicon nitride (TiSiN), and molybdenum silicon nitride (MSiN). Exemplary transition metal silicon carbides include titanium silicon carbide (TiSiC) and tungsten silicon carbide (WSiC). Exemplary transition metal quaternary compounds include silicon carbonitrides such as silicon carbonitride, titanium silicon carbonitride, and tantalum silicon carbonitride.

Since the fluorides of the transition metals are more volatile, it is preferred to convert the transition metal portion of these substances into fluorides. This conversion is accomplished by contacting the substance to be removed with a process gas comprising a fluorine-containing gas. Examples of fluorine-containing gases include: $NF_3$ (nitrogen trifluoride), $ClF_3$ (chlorine trifluoride), ClF (chlorine monofluoride), $SF_6$ (sulfur hexafluoride), perfluorocarbons such as $CF_4$ and $C_2F_6$ etc, hydrofluorocarbons such as $CHF_3$ and $C_3F_7H$ etc., $NF_xCl_{3-x}$, where x ranges from 1 to 2, HF, and molecular $F_2$ etc. The fluorine-containing gases can be delivered by a variety of means, such as, but not limited to, conventional cylinders, safe delivery systems, vacuum delivery systems, or solid or liquid-based generators that create the reactive gas at the point of use. The concentration of the fluorine-containing gas can range from 0.1 to 100%.

In addition to the fluorine-containing gases described herein, additive gases such as hydrogen, nitrogen, $CO_2$, helium, neon, argon, krypton, xenon and mixtures thereof can also be added to the process gas. In certain instances, additive gases can modify the plasma characteristics and cleaning processes to better suit some specific applications. The concentration of the additive gases within the process gas can range from 0 to 99% or from 20% to 90% by volume.

In certain embodiments, the process gas can further contain an oxygen-containing gas. Exemplary oxygen-containing gases include $O_2$, $O_3$, CO, $CO_2$, $NO_2$, and $N_2O$. In these embodiments, the amount of oxygen-containing gas present in the mixture may range from 20 to 90 by volume. In alternative embodiments, however, the process gas is substantially free of an oxygen-containing gas.

The reaction between the one or more fluorine-containing gases or gas mixtures and the transition metal ternary compound may be activated by one or more energy sources such as, but not limited to, in situ plasma, remote plasma, remote thermal/catalytic activation, in-situ thermal heating, electron attachment, and photo activation. These processes may be used alone or in combination.

Thermal or plasma activation and/or enhancement can significantly impact the efficacy of the etching and cleaning of transition metal ternary compounds. In thermal heating activation, the process chamber components are heated either by resistive heaters or by intense lamps. Cleaning gases are thermally decomposed into reactive radicals and atoms that subsequently volatize the deposition residues. Elevated temperature may also provide the energy source to overcome reaction activation energy barrier and enhance the reaction rates. For thermal activation, the substrate can be heated to at least 100° C., or at least 300° C., or at least 500° C. In embodiments wherein at least one of the fluorine-containing gases is $NF_3$, the substance can be heated up to at least 300° C., or at least 400° C., or at least 600° C. In these embodiments, the temperature may range from about 450° C. to about 700° C. Different process gases may use different temperature ranges. For example, if the process gas contains $ClF_3$ or $F_2$ as the fluorine-containing gas, the temperature may range from about 100° C. to about 700° C. In any of these embodiments, the pressure may range from 10 mTorr to 760 Torr, or from 1 Torr to 760 Torr.

In embodiments wherein an in situ plasma source is used to activate the cleaning chemistry, fluorine-containing gas molecules such as $NF_3$ may be broken down by the discharge to form reactive fluorine-containing ions and radicals. The fluorine-containing ions and radicals can react with the transition metal ternary compounds to form volatile species that can be removed from the process chamber by vacuum pumps. For in situ plasma activation, the in situ plasma can be generated with a 13.56 MHz RF power supply, with RF power density of at least 0.2 W/cm$^2$, or at least 1 W/cm$^2$, or at least 3 W/cm$^2$. Alternatively, the in situ plasma can be operated at RF frequencies lower than 13.56 MHz to enhance cleaning of grounded chamber walls and/or fixtures contained therein. The operating pressure may range from 2.5 mTorr to 100 Torr, or from 5 mTorr to 50 Torr, or from 10 mTorr to 20 Torr. In one particular embodiment, the process is conducted at a pressure of 5 torr or less. In these embodiments, an in situ energy source, such as in situ RF plasma, can be combined with a thermal and/or remote energy source. This particular embodiment ensures plasma stability and negligible damage to the process chamber and fixtures contained therein.

A remote energy source, such as, but not limited to, a remote plasma source activated by RF, microwave, or ICP activation, a remote thermal activation source, a remote catalytically activated source, or a remote source which combines thermal and catalytic activation, can be used to generate the volatile product. In remote plasma cleaning, the process gas is activated to form reactive species outside of the process chamber which are introduced into the process chamber to volatize the substance to be removed. In remote thermal activation, the process gas first flows through a heated area outside of the process chamber. The gas dissociates by contact with the high temperatures within a vessel outside of the chamber to be cleaned. Alternative approaches include the use of a remote catalytic converter to dissociate the process gas, or a combination of thermal heating and catalytic cracking to facilitate activation of the oxygen and fluorine sources within the process gas. In these embodiments, reactions between remote plasma generated reactive species and the deposition residues can be activated/enhanced by heating the process chamber to temperatures of at least 300° C., or at least 400° C., or at least 600° C.

In embodiments where temperatures greater than about 300° C. are not suitable due to thermally labile materials present on the substrate or within the reaction chamber, alternative activations processes can be employed. In remote thermal activation, the cleaning gas first flows through a heated area outside of the vessel to be cleaned. Here, the gas dissociates by contact with the high temperatures within a vessel outside of the vessel to be cleaned. Alternative approaches include the use of a catalytic converter to dissociate the process gas, or a combination of thermal heating and catalytic cracking to facilitate activation of the cleaning gases.

In certain embodiments, reactions between remote plasma generated reactive species and the transition metal ternary compound can be activated/enhanced by heating the process chamber. The reaction between the remote plasma generated reactive species and transition metal ternary compound can be activated and/or enhanced by heating the process chamber to a temperature sufficient to dissociate the fluorine containing gas within the process gas. The specific temperature required to activate the cleaning reaction with the substance to be removed depends on the process gas recipe.

In one particular embodiment, a combination of a remote plasma and in situ plasma are employed as energy sources to activate the process gas to form the reactive species. In this embodiment, a first portion of the process gas is activated in an area outside of the process chamber, which is introduced into the process chamber after activation. A second portion of the process gas is activated within the process chamber along with any portion of the first activated gas in which the reactive species may have recombined.

In alternative embodiments, the molecules of the fluorine-containing gas within the process gas can be dissociated by intense exposure to photons to form reactive species. For example ultraviolet, deep ultraviolet and vacuum ultraviolet radiation can assist breaking strong chemical bonds in the ternary compounds as well as dissociating the fluorine-containing gas within the process gas thereby increasing the removal rates of ternary compounds. Other means of activation and enhancement to the processes described herein can also be employed. For example, one can use photon induced chemical reactions to generate reactive species and enhance the etching/cleaning reactions.

The process will be illustrated in more detail with reference to the following Examples, but it should be understood that the process is not deemed to be limited thereto.

EXAMPLES

The following are experimental examples for dry etching/cleaning of tantalum or tungsten containing ternary barrier materials such as $WN_xC_y$ films/residues. Depending upon the activation method, the process chamber was configured with a remote plasma generator, parallel plate electrodes for in situ plasma generation, or a heating pedestal for thermal reactions. Unless otherwise stated, the sample coupons comprise a silicon wafer that is first coated via ALD with an approximately 20 nm thick layer of silicon dioxide and then coated via ALD with a layer of tungsten nitride carbide ($WN_{0.3}C_{0.7}$). For in-situ and thermal experiments, the thickness of the tungsten nitride carbide layer is about 20 nm; for remote experiments, the thickness of the tungsten nitride carbide layer is about 90 nm.

For each experimental run, a sample coupon was put onto a carrier wafer and loaded onto the process chamber chuck through a load lock. The process chamber was then evacuated. Process gases were fed into the process chamber and the chamber pressure was stabilized. The process gases were then activated by any one of the several activation mechanisms. The thickness of the $WN_xC_y$ film on a coupon was measured by several methods. For very thin films with good optical transparency (<20 nm), the film thickness was measured by spectroscopic ellipsometry both before and after a timed exposure of the etching/cleaning process. For thick films with poor optical transparency (>20 nm), a four-point electric conductivity probe was used to measure the film thickness both before and after the etching/cleaning processes. To verify the accuracy of the electrical four-point probe measurements, some of the samples coupons were cut into cross sections after the etching/cleaning process. The coupon cross sections were then examined by scanning electron microscopy (SEM) to accurately determine the $WN_xC_y$ film thickness after the processing. The SEM results were consistent with the four-point probe measurements. The sample coupons were characterized by spectroscopic ellipsometry for film thickness before and after each cleaning cycle to determine changes in film thickness. Change in barrier film thickness after plasma processing is then used to calculate the etch rate.

Example 1

Remote Plasma Cleaning of Ternary Tungsten Nitride Carbide ($WN_xC_y$) Materials FIG. 1 provides an illustration of the experimental setup for remote plasma cleaning. An ASTRON® remote plasma generator 10 manufactured by MKS Instruments of Wilmington, Mass. was mounted on top of process chamber 20. The distance "d" between the exit of remote plasma generator 10 and the sample coupon 30 is about six inches. Table 1 lists the experiment recipes and $WN_xC_y$ etch rates. In all of the runs, the chamber pressure was kept at 4 Torr. The thickness of the tungsten nitride carbide layer on the sample coupon is about 90 nm.

Each run was conducted in the following manner: vent chamber and open front door; load sample coupons and close front door; evacuate chamber to reach baseline vacuum pressure; introduce argon (Ar) gas and stabilize pressure; turn on the remote plasma power; introduce process gases; turn off the remote plasma power after 1 minute; stop process flows and evacuate chamber; and vent chamber and retrieve sample coupons for analysis. The flow rates of the fluorine-containing gas, additive gas, and oxygen-containing gas and the etch rates are provided in Table 1. The term "sccm" denotes standard cubic centimeter per minute.

TABLE 1

Remote plasma etching of $WN_xC_y$ materials

| Run# | $NF_3$ flow (sccm) | Ar flow (sccm) | $O_2$ flow (sccm) | $WN_xC_y$ etch rate (nm/min) |
|---|---|---|---|---|
| 1 | 50 | 50 | 50 | 18 |
| 2 | 50 | 50 | 25 | 17 |
| 3 | 50 | 50 | 10 | 27 |
| 4 | 50 | 50 | 5 | 28 |
| 5 | 50 | 50 | 0 | 38 |

Example 2

In Situ Plasma Cleaning of $WN_xC_y$

Figure 2:
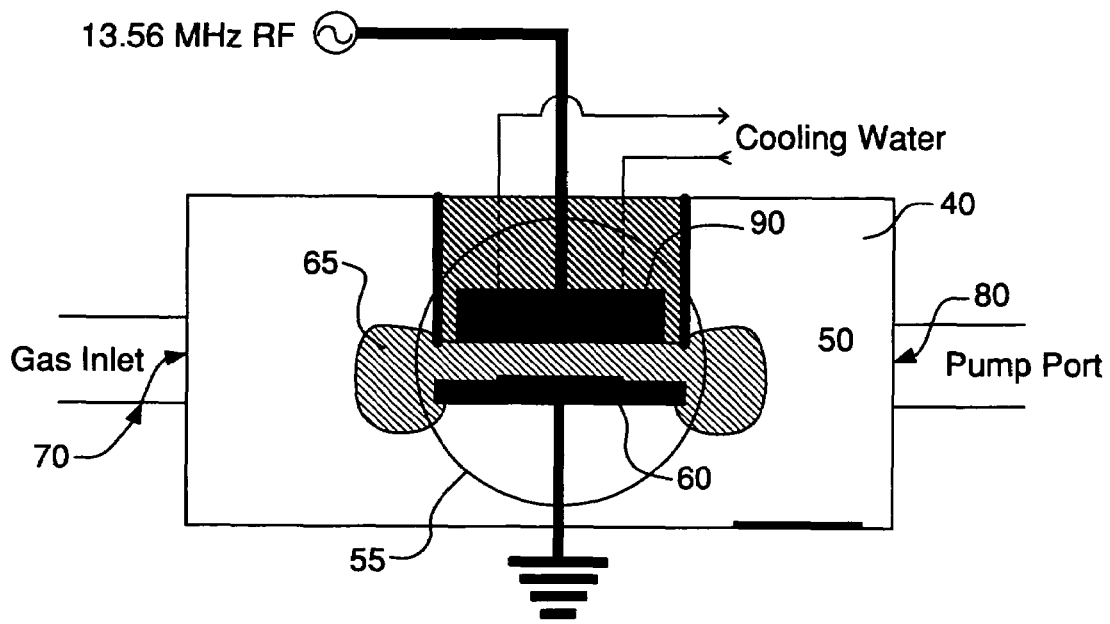
FIG. 2 is a schematic diagram of an experimental apparatus relating to in situ plasma cleaning.

FIG. 2 provides an illustration of the experimental setup for in situ plasma cleaning of $WN_xC_y$. The experiments were run in a capacitively coupled parallel plate process chamber 40. The gap spacing between the two electrodes was one inch. A sample coupon 50 was placed on the center of the grounded lower electrode 60 so that it is in direct contact with the plasma. There is no dc self-bias voltage and no RF driven voltage at grounded electrode and chamber walls. Process gases were introduced from a side port 70 and pumped out through another port 80 on the opposite side of the chamber. RF power was applied to the top electrode 90, which was water cooled at 20° C. The thickness of the tungsten nitride carbide layer on the sample coupon is about 20 nm.

Each run was conducted in the following manner: process chamber 40 was loaded with sample coupons 50 and sample loading door 55 was closed. Chamber 40 was evacuated to reach baseline vacuum pressure. Process gases containing $NF_3$ was introduced and the pressure was stabilized. The RF power to top electrode 90 was activated for 1 minute thereby generating a $NF_3$ plasma field 65. The process gas was stopped and chamber 40 was evacuated. Chamber 40 was vented and sample coupons 50 were retrieved and analyzed.

Initial screening experiments were conducted using the following parameters: 13.56 MHz RF power at 50-150 W, or power density of 0.6-1.8 W/cm$^2$; chamber pressure 0.5-4.5 Torr, 10-20 mole % of $NF_3$ diluted with helium with a total gas flow of 100 standard cubic centimeters per minute (sccm). In this series of experiments, removal of $WN_xC_y$ was observed on sample coupons that were placed in the center of process chamber 40 for all $NF_3$ concentrations between 10 and 20 mole % during the initial screen DOE.

Figure 3:
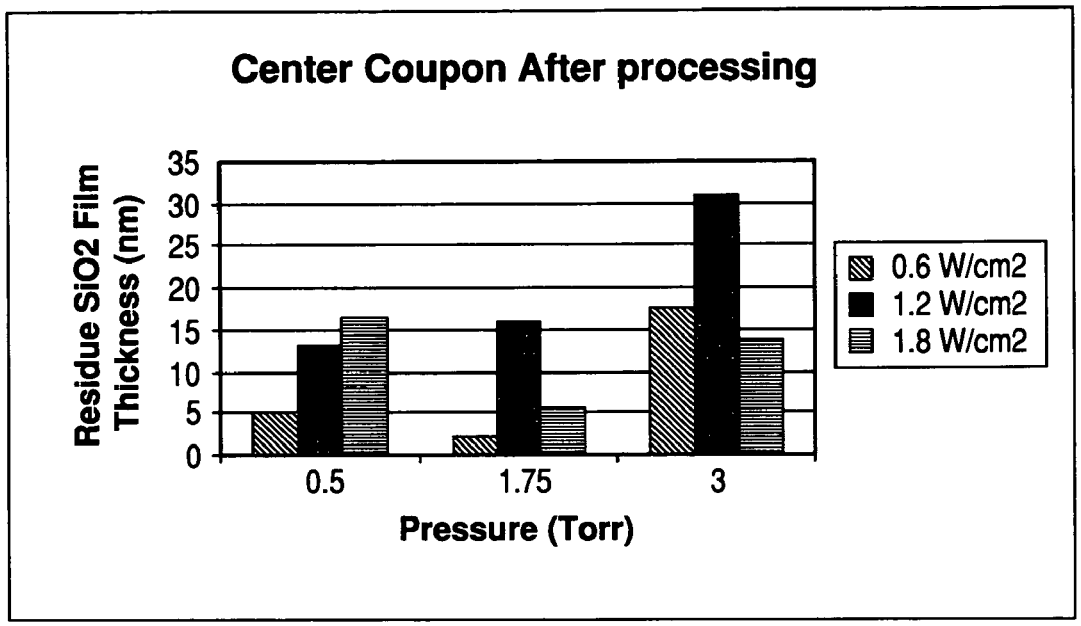
FIG. 3 is a plot of pressure vs. the thickness of the residual $SiO_2$ film for films subjected to different power densities.

In subsequent experiments, $NF_3$ concentration was fixed at 12.5 mole %, while systematically changing RF power between 50 and 150 W, or power density between 0.6 and 1.8 W/cm$^2$, and pressure between 0.5 and 3 Torr. For all the sample coupons placed upon the grounded electrode 60, the top $WN_xC_y$ layer was completely removed after 1 minute processing under all conditions. In some cases, a significant portion of the underlying $SiO_2$ layer was also removed after the complete-removal of the top $WN_xC_y$ layer. Therefore, the residue $SiO_2$ film thickness is an indicator of the relative rate to remove the $WN_xC_y$ top layer: the less the $SiO_2$ residue film thickness, the higher the rate of removal of $WN_xC_y$ layer. The results are provided in FIG. 3. The residue $SiO_2$ film appeared to be thicker in the 1.2 W/cm$^2$ and 3 Torr run. This was because the sample surface became coarse which made it difficult for the spectroscopic ellipsometer to accurately determine the film thickness. Nevertheless, in all of sample coupons, the top $WN_xC_y$ layer was completely removed.

Example 3

Thermal $NF_3$ Cleaning of $WN_xC_y$

Figure 4:
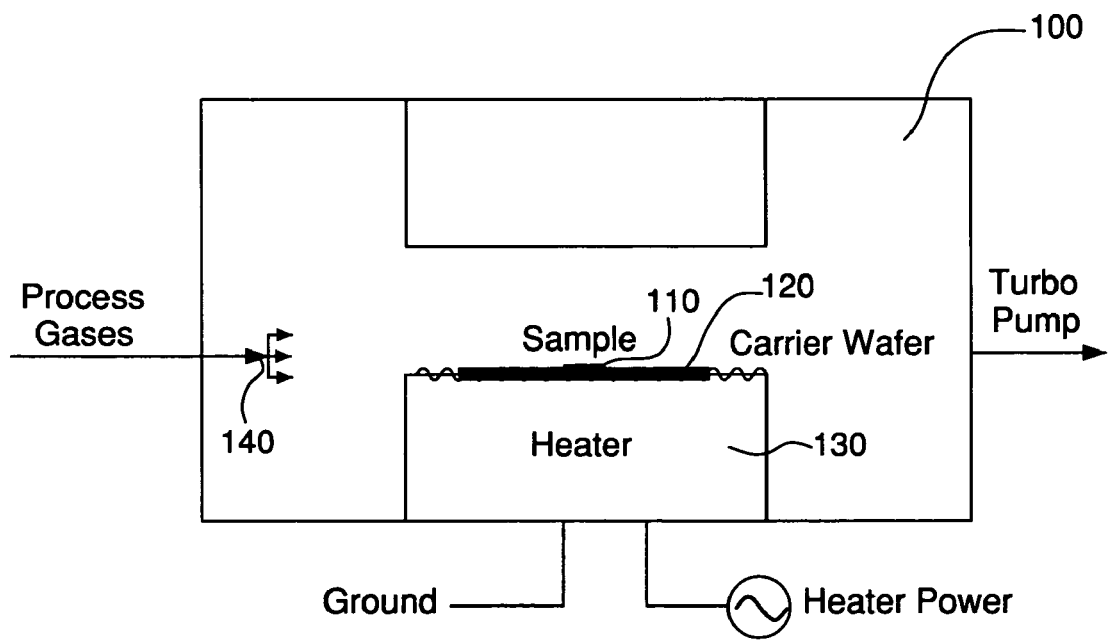
FIG. 4 is a schematic diagram of an experimental apparatus relating to thermal cleaning.

FIG. 4 is a schematic diagram of the experimental setup for thermal clean of $WN_xC_y$ sample coupons. This process chamber 100 was modified from the in situ plasma process chamber 40 shown in FIG. 2. The sample coupon 110 was placed on a 4 inch carrier wafer 120, which was placed on a heated pedestal 130. Other aspects of the process chamber design were similar to those described in FIG. 2. After the introduction of the sample coupon and evacuation of the process chamber, the pedestal and the sample coupon was heated by a resistive heater to reach a preset temperature. A process gas 140 containing the fluorine-containing gas $NF_3$ was then fed into the process chamber 100 to reach a preset chamber pressure to remove the $WN_xC_y$ film from the sample coupon 110. The sample coupons were measured by spectroscopic ellipsometer before and after the processing. The thickness of the tungsten nitride carbide layer on the sample coupon is about 20 nm. Table 2 lists the process recipes and results. It can be seen that $WN_xC_y$ film can be rapidly removed at a temperature of 450° C. or higher. Increasing pressure may increase $WN_xC_y$ removal rate. The total process time included the time to reach set pressure. Since it took much longer time to reach higher pressure, the true removal rate at higher pressures may be faster than those given in Table 2. At 350° C., the observed removal rates were very low since very little $NF_3$ was decomposed to release reactive at 350° C. Adding 50 sccm of $O_2$ to 50 sccm of $NF_3$ in the process gas mixture at 350° C. did not improve the removal rate.

TABLE 2

Thermal $NF_3$ cleaning of $WN_xC_y$

| Run# | T (° C.) | P (Torr) | $NF_3$ Flow (sccm) | $O_2$ Flow (sccm) | Total process time (min) | $WN_xC_y$ removal rate (nm/min) |
|---|---|---|---|---|---|---|
| 1 | 350 | 100 | 50 | 0 | 15 | 0.4 |
| 2 | 350 | 200 | 50 | 0 | 30 | 0.56 |
| 3 | 350 | 300 | 50 | 0 | 25 | 0.69 |
| 4 | 350 | 100 | 50 | 50 | 15 | 0.16 |
| 5 | 450 | 100 | 50 | 0 | 10 | (>>2.73*) |
| 6 | 450 | 50 | 50 | 0 | 5 | (>>5.46*) |
| 7 | 450 | 20 | 50 | 0 | 2 | 10.71 |

*Note:
The $WN_xC_y$ top layer was completely removed, and the $SiO_2$ under layer was partially removed. As a result, $WN_xC_y$ removal rate cannot be accurately estimated.

Example 4

Comparison of Remote NF$_3$ Plasma Cleaning of Transition Metal Binary compound WC and Transition Metal Ternary Compound Remote NF$_3$ plasma etching/cleaning of sample coupons having a tungsten carbide (WC) film or a tungsten nitride carbide film was conducted using the same method described in Example 1. For the tungsten carbide coupons, about 3 micrometer thick tungsten carbide (WC) film was coated by physical vapor deposition (PVD) onto 1" square stainless steel sample coupon. For direct comparison, one WC sample and one WN$_x$C$_y$ sample were placed side-by-side onto the same carrier wafer in the experiments. Furthermore, to ensure that only the top film coated-surface is exposed to the cleaning chemistry, the edges of both sample coupons were sealed to the carrier wafer by Kapton tapes. After placing the samples inside the process chamber, and the process chamber was evacuated, the following NF$_3$ remote plasma was operated for three minutes: 50 sccm Ar, 50 sccm NF$_3$, and 4.0 torr. The rates of removal of WC and WN$_x$C$_y$ films are determined by the weight changes of each sample after the processing. The sample weights of each sample were measured by a precision balance. The results are given in Table 3.

TABLE 3

Comparison of NF$_3$ remote plasma etching/cleaning of WN$_x$C$_y$ and WC film

| Sample | Weight before etching (g) | Weight after etching (g) | Weight change (g) | Etch Time (min) | Etch rate (mg/min) |
|---|---|---|---|---|---|
| WN$_x$C$_y$ | 6.5362 | 6.533 | 0.0032 | 3 | 1.07 |
| WC | 44.4711 | 44.471 | 0.0001 | 3 | 0.03 |

Table 3 shows that a process gas containing NF$_3$ is effective in removing ternary transition metal nitride carbide such as WN$_x$C$_y$, but is not effective in removing a binary transition metal carbide such as WC.

While the invention has been described in detail and with reference to specific examples thereof, it will be apparent to one skilled in the art that various changes and modifications can be made therein without departing from the spirit and scope thereof.

The invention claimed is:

1. A process for removing a substance from at least a portion of a substrate, said process comprising:
   providing the substrate comprising the substance, wherein the substance is a transition metal ternary compound selected from the group consisting of TaN$_x$C$_y$, WN$_x$C$_y$, TaSi$_x$C$_y$, WSi$_x$C$_y$ and mixtures thereof and wherein x and y independently range from 0.05 to 10.0;
   reacting the substance with a process gas comprising a fluorine-containing gas and optionally an additive gas to form a volatile product; and
   removing the volatile product from the substrate to thereby remove the substance from the substrate.

2. The process of claim 1, wherein the fluorine-containing gas is selected from NF$_3$, ClF$_3$, ClF, SF$_6$, a perfluorocarbon, hydrofluorocarbon, HF, F$_2$, a gas having the formula NF$_n$Cl$_{3-n}$, where n is a number ranging from 1 to 2, and mixtures thereof.

3. The process of claim 2, wherein the fluorine-containing gas is NF$_3$.

4. The process of claim 1, wherein the fluorine-containing gas is conveyed to the substance from a gas cylinder, a safe delivery system, a pipeline, a point of use delivery system, a vacuum delivery system, and combinations thereof.

5. The process of claim 1, wherein the fluorine-containing gas is formed in close proximity to the process chamber by a point-of-use generator.

6. The process of claim 1, wherein the process gas comprises the additive gas.

7. The process of claim 1, wherein the process gas further comprises an oxygen-containing gas.

8. The process of claim 1, wherein the process gas is substantially free of an oxygen-containing gas.

9. The process of claim 1, wherein the reacting step is conducted by an in situ plasma, a remote plasma, an in-situ thermal source, a remote thermal source, a remote catalytic source, a photon activation source, and combinations thereof.

10. The process of claim 1, wherein the reacting step is conducted by a remote plasma.

11. The process of claim 1, wherein the substrate is a semiconductor substrate and the process etches selected portions of the substance from the semiconductor substrate.

12. The process of claim 1, wherein the substrate is a process chamber and the process cleans deposition from the process chamber.

13. The process of claim 1, wherein the substance is coated on the substrate by atomic layer deposition.

14. A process for cleaning a substance from a process chamber surface, said process comprising:
   providing a process chamber containing the process chamber surface wherein the process chamber surface is at least partially coated with a film comprising a transition metal ternary compound selected from the group consisting of TaN$_x$C$_y$, WN$_x$C$_y$, TaSi$_x$C$_y$, WSi$_x$C$_y$, and mixtures thereof and wherein x and y independently range from 0.05 to 10.0;
   reacting the substance with a process gas comprising a fluorine-containing gas to form a volatile product wherein the fluorine-containing gas comprises at least one member selected from NF$_3$, ClF$_3$, ClF, SF$_6$, a perfluorocarbon, a hydrofluorocarbon, HF, F$_2$, a gas having the formula NF$_n$Cl$_{3-n}$, where n is a number ranging from 1 to 2, and mixtures thereof; and
   removing the volatile product from the process chamber to thereby remove the substance from the substrate.

15. The process of claim 14, wherein the process chamber is one selected from an atomic layer deposition process chamber and an atomic layer chemical vapor deposition process chamber.

16. A process for removing a substance from at least a portion of a substrate, said process comprising:
   providing the substrate having the substance comprising a transition metal carbonitride;
   reacting the substance with a process gas comprising a fluorine containing gas and optionally an additive gas to form a volatile product; and
   removing the volatile product from the substrate to thereby remove the substance from the substrate.

17. The process of claim 16, wherein the transition metal carbonitrides is at least one selected from titanium carbonitride (TiNC), tantalum carbonitride (TaNC), chromium carbonitride, tungsten carbonitride, molybdenum carbonitride, zirconium carbonitrides, and mixtures thereof.

18. A process for removing a substance from at least a portion of the substrate, said process comprising:

providing the substrate having the substance comprising a transition metal silicon carbide;

reacting the substance with a process gas comprising a fluorine containing gas and optionally, an additive gas to form a volatile product; and removing the volatile product from the substrate to thereby remove the substance from the substrate.

19. A process for removing a substance from at least a portion of a substrate, said process comprising:

providing the substrate having the substance comprising a transition metal quaternary compound;

reacting the substance with a process gas comprising a fluorine containing gas and optionally, an additive gas to form a volatile product; and removing the volatile product from the substrate to thereby remove the substance from the substrate.

* * * * *